(12) United States Patent
Heo et al.

(10) Patent No.: US 11,864,450 B2
(45) Date of Patent: Jan. 2, 2024

(54) DISPLAY DEVICE, AND METHOD FOR MANUFACTURING THE SAME

(71) Applicant: LG Display Co., Ltd., Seoul (KR)

(72) Inventors: Joonyoung Heo, Seoul (KR); Kyunghoon Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 330 days.

(21) Appl. No.: 17/394,231

(22) Filed: Aug. 4, 2021

(65) Prior Publication Data

US 2022/0077248 A1 Mar. 10, 2022

(30) Foreign Application Priority Data

Sep. 7, 2020 (KR) .................. 10-2020-0114124

(51) Int. Cl.
| | |
|---|---|
| *H01L 21/00* | (2006.01) |
| *H10K 59/65* | (2023.01) |
| *H10K 50/844* | (2023.01) |
| *H10K 59/122* | (2023.01) |
| *H10K 59/131* | (2023.01) |
| *H10K 59/35* | (2023.01) |
| *H10K 71/00* | (2023.01) |
| *H10K 59/12* | (2023.01) |

(52) U.S. Cl.
CPC .......... *H10K 59/65* (2023.02); *H10K 50/844* (2023.02); *H10K 59/122* (2023.02); *H10K 59/131* (2023.02); *H10K 59/353* (2023.02); *H10K 71/00* (2023.02); *H10K 59/1201* (2023.02)

(58) Field of Classification Search
CPC ............................. H10K 59/353; H10K 59/65
See application file for complete search history.

(56) References Cited

U.S. PATENT DOCUMENTS

| | | | |
|---|---|---|---|
| 2019/0214601 A1* | 7/2019 | Park | ................ H10K 50/8445 |
| 2020/0357871 A1* | 11/2020 | Chung | ................ H10K 50/865 |
| 2021/0193769 A1* | 6/2021 | Bok | ................ H10K 59/60 |
| 2021/0351236 A1* | 11/2021 | Shin | ................ H04M 1/0268 |

FOREIGN PATENT DOCUMENTS

| | | |
|---|---|---|
| KR | 10-2018-0079059 A | 7/2018 |
| KR | 10-2020-0029885 A | 3/2020 |
| KR | 10-2020-0039866 A | 4/2020 |

* cited by examiner

*Primary Examiner* — Douglas M Menz
(74) *Attorney, Agent, or Firm* — Seed IP Law Group LLP

(57) ABSTRACT

A display device includes a display panel including a display area from which an image is output, and the display area includes a camera area overlapping a camera disposed below a rear face of the display panel. The display device provides an imaging function achieve by the camera. The camera area includes a unit pixel area for displaying an image and a transmissive area for transmitting light therethrough. Thus, a separate area that overlaps the camera and does not display an image does not need to be present in the display area. Accordingly, increase in a bezel width and deformation of the display area due to the camera may be prevented.

17 Claims, 15 Drawing Sheets

DISPLAY DEVICE, AND METHOD FOR MANUFACTURING THE SAME

CROSS-REFERENCE TO RELATED APPLICATION

This application claims a benefit under 35 U.S.C. § 119(a) of Korean Patent Application No. 10-2020-0114124 filed on Sep. 7, 2020, on the Korean Intellectual Property Office, the entirety of disclosure of which is incorporated herein by reference for all purposes.

BACKGROUND

Technical Field

The present disclose relates to a display device including a camera, and a method for manufacturing the display device.

Description of the Related Art

As the information society develops, various portable smart devices such as notebooks, tablet PCs, smart phones and smart watches are widely used. In general, these portable devices have not only an image display function, but also a data generation function in various ways. The function of generating image data using a camera is known to a user as a very essential function used for performance evaluation of the portable smart device.

Accordingly, a display device provided as a smart device may include a display panel for an image display function and a camera for an image data generation function.

BRIEF SUMMARY

The display panel may include a signal line or an electrode pattern made of a light-screening material. In order to prevent the camera's sensitivity from deteriorating due to the light-screening material, the camera may be disposed in a non-display area outside a display area of the display panel. The inventors of the present disclosure have recognized that in this case, there is a problem in that a width of a bezel of the display device may increase due to the presence of the camera.

Alternatively, to prevent the increase in the width of the bezel, the camera may be disposed on a display face of the display panel and may overlap with a portion of the display area of the display panel. The inventors of the present disclosure have also recognized that in this case, due to the arrangement of the camera, the display area of the display panel may be deformed into a shape different from a rectangular shape as a general screen shape of image data. Thus, there is a limitation in improving user convenience.

The inventors of the present disclosure have provided one or more embodiments that address the above recognized technical problems in the related art as well as other problems not mentioned above in the related art.

For instance, one or more embodiments of the present disclosure provides a display device having a camera in which the increase of the bezel width and the deformation of the display area due to the camera is prevented.

The various technical benefits according to the present disclosure are not limited to the above-mentioned benefits associated with the problems in the related art. Other technical benefits and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

An example according to the present disclosure provides a display device including a display panel including a display area, wherein the display area includes a camera area overlapping a camera disposed below a rear face of the display panel. Such a display device may provide an imaging function using the camera.

The display area includes a plurality of sub-pixel areas, wherein at least two sub-pixel areas adjacent to each other among the plurality of sub-pixel areas correspond to one unit pixel area, wherein the camera area of the display area further includes a plurality of transmissive areas which are alternately arranged with at least two unit pixel areas. That is, the camera area includes the unit pixel area for displaying an image and the transmissive area for transmitting light therethrough. Therefore, a separate area that overlaps the camera and does not display an image need not be present in the display area. Accordingly, the increase in the bezel width and the deformation of the display area due to the camera may be prevented.

In this connection, the display panel includes a bank corresponding to an outer periphery of each of the plurality of sub-pixel areas, and a partition disposed above the bank and corresponding to each of the plurality of transmissive areas. This partition may allow a transmittance of the transmissive area to be improved.

The display device according to an embodiment according to the present disclosure includes the display panel including the display area, and the display area includes the camera area overlapping the camera disposed below a rear face of the display panel. The camera area includes the unit pixel areas and the transmissive areas alternately arranged with each other, and the display panel includes the partition disposed above the bank and corresponding to the transmissive area.

The display device having this configuration may include the camera to provide an imaging function.

Further, since the camera area overlapping the camera in the display area of the display panel includes the transmissive area, external light may pass through the display panel through the transmissive area and be transmitted to the camera. As a result, the sensing ability of the camera disposed below the rear face of the display panel may be prevented from deteriorating. In addition, since the camera area overlapping the camera includes the unit pixel area, the increase in the bezel width and the deformation of the display area due to the camera may be prevented.

Effects of the present disclosure are not limited to the above-mentioned effects, and other effects as not mentioned will be clearly understood by those skilled in the art from following descriptions.

DETAILED DESCRIPTIONS

Figure 1:
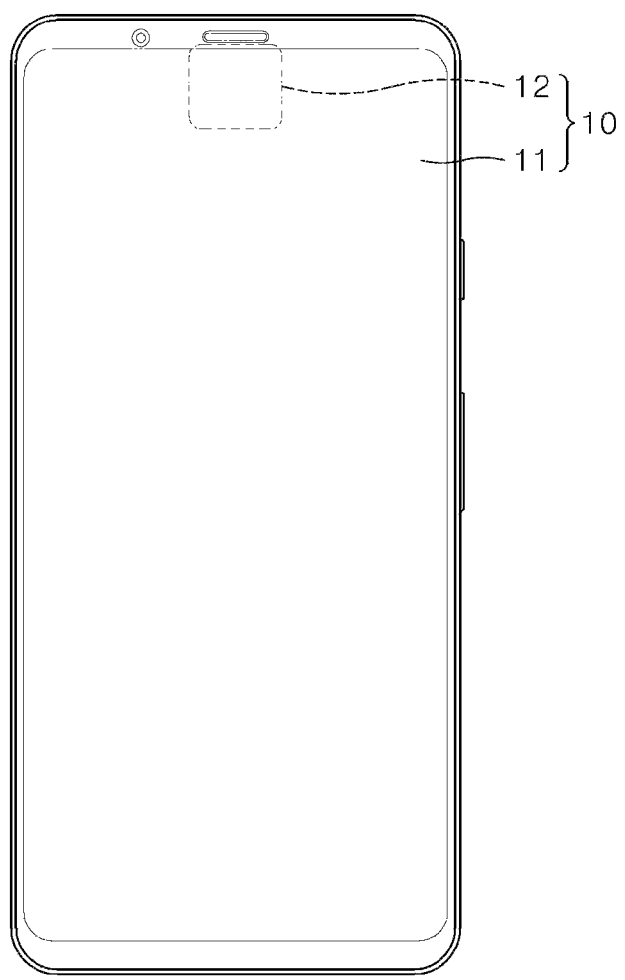
FIG. 1 is an example of a front face of a display device according to an embodiment according to the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs.

A shape, a size, a ratio, an angle, a number, etc. disclosed in the drawings for describing the embodiments of the present disclosure are as examples, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

In descriptions of temporal relationships, for example, temporal precedent relationships between two events such as "after," "subsequent to," "before," etc., another event may occur therebetween unless "directly after," "directly subsequent" or "directly before" is not indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Terms such as "about," "roughly," "approximately," "substantially," and the like may be used herein for ease of description. A person having ordinary skill in the art will be able to understand and derive meanings for such terms. For example, about may indicate variation in a dimension of 20%, 10%, 5% or the like, but other values may be used when appropriate. "Substantially" is generally more stringent than "about," such that variation of 10%, 5% or less may be appropriate, without limit thereto. Again, a person having ordinary skill in the art will be able to understand and derive appropriate meanings for such terms based on knowledge of the industry, current fabrication techniques, and the like.

The term "cover" as used herein is used to mean either at least partially covering or entirely covering depending on the embodiments.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device and a method for manufacturing the display device according to an embodiment according to the present disclosure will be described with reference to the accompanying drawings.

First, a display device according to an embodiment according to the present disclosure will be described with reference to FIG. 1, FIG. 2, FIG. 3, FIG. 4, FIG. 5, FIG. 6, FIG. 7, FIG. 8, and FIG. 9.

FIG. 1 is an example of a front face of a display device according to an embodiment according to the present disclosure.

As shown in FIG. 1, a display device DD according to an embodiment of the present disclosure may be embodied as a smart device such as a smartphone. The display device DD includes a display panel (not shown) including a display area 10 having an image display function and a camera (not shown) having an imaging function.

In one example, the display area 10 may define a front face of the display device DD.

Further, the camera (not shown) may generate image data of an object in front of the display device DD. In this connection, the camera refers to a device composed of a sensor that detects light. Alternatively, an optical sensor such as a CCD (Charge Coupled Device) and an infrared sensor may be used instead of the camera.

The camera (not shown) may be disposed below a rear face of the display panel (not shown) including the display area 10. That is, the camera (not shown) overlaps a portion of the display area 10.

Accordingly, the display area 10 includes a general area 11 that does not overlap with the camera (not shown) and a camera area 12 that overlaps with the camera.

The camera (not shown) detects an amount of light in each of areas in front thereof and generates image data based on the detected amount.

The camera area 12 transmits light to be directed to the camera (not shown) therethrough while displaying an image. The camera area 12 has a structure in which unit pixel areas for displaying an image and transmissive areas for transmitting light therethrough to be directed to the camera (not shown) are alternately arranged with each other. In other words, a resolution of the unit pixel area in the camera area 12 is lower than that in the general area 11. Hereinafter, this will be described in detail.

As mentioned above, the display device DD includes a display panel for displaying an image.

Figure 2:
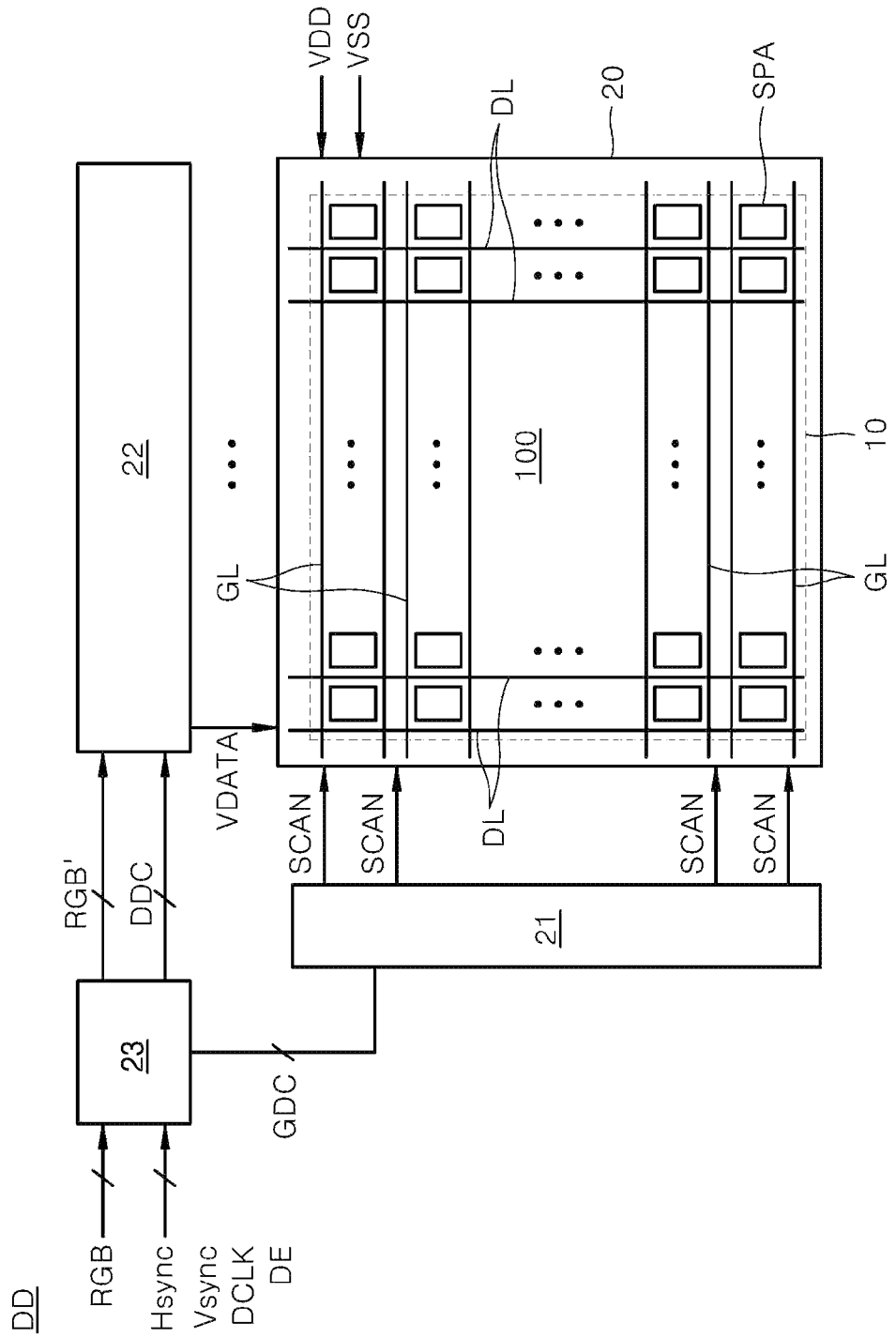
FIG. 2 is a diagram showing an example of a display device according to an embodiment according to the present disclosure.
Figure 3:
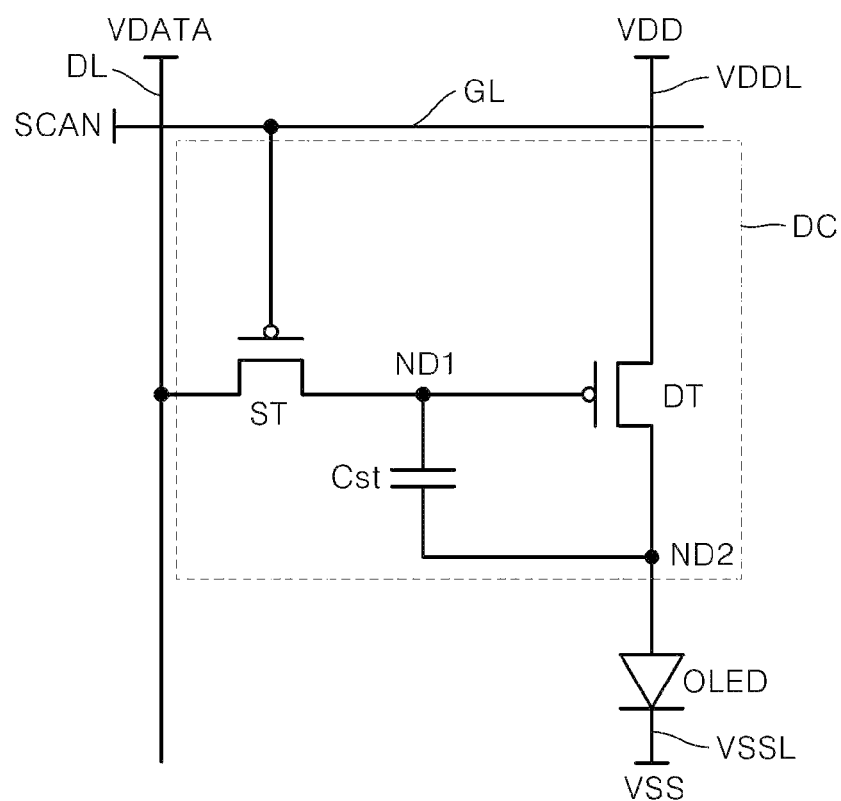
FIG. 3 is a diagram showing an example of an equivalent circuit corresponding to one sub-pixel area of a display area of FIG. 2.

FIG. 2 is a diagram showing an example of a display device according to an embodiment according to the present disclosure. FIG. 3 is a diagram showing an example of an equivalent circuit corresponding to one sub-pixel area in the display area of FIG. 2.

As shown in FIG. 2, the display device DD include a display panel 20 including the display area 10, and a gate driver 21, a data driver 22, and a timing controller 23 for supplying signals to signal lines GL and DL of the display panel 20.

The display panel 20 includes a display area 10 for displaying an image. A plurality of sub-pixel area SPAs may be defined in the display area 10.

Each sub-pixel area SPA emits light corresponding to one color.

At least two sub-pixel area SPAs adjacent to each other among the plurality of sub-pixel area SPAs correspond to one unit pixel area.

That is, at least two sub-pixel areas corresponding to one unit pixel area correspond to at least two colors. Thus, via a combination of colors emitted from the at least two sub-pixel areas included in each unit pixel area, each unit pixel area emits light of various colors. In this connection, the at least two colors may include red, green and blue. Alternatively, an unit color may further include white.

The display panel 20 includes the signal lines GL and DL that supply signals for driving each sub-pixel area SPA. That is, the display panel 20 includes a gate line GL supplying a scan signal SCAN and a data line DL supplying a data signal VDATA.

Further, when the display panel 20 includes a light-emissive element corresponding to each sub-pixel area, the display panel 20 may further include first and second driving power lines for respectively supplying first and second driving powers VDD and VSS for driving the light-emissive element.

The display device DD further includes the gate driver 21, the data driver 22 and the timing controller 23 to drive the display panel 20.

The timing controller 23 rearranges the digital video data RGB input from an outside to match a resolution of the display panel 20, and supplies the rearranged digital video data RGB' to the data driver 22.

The timing controller 23 supplies a data control signal DDC to control the operation timing of the data driver 22 and a gate control signal GDC to control the operation timing of the gate driver 21, based on timing signals such as a vertical synchronization signal Vsync, a horizontal synchronization signal Hsync, a dot clock signal DCLK and a data enable signal DE.

The gate driver 21 sequentially supplies a scan signal SCAN to a plurality of gate lines GL corresponding to a plurality of horizontal lines corresponding to the plurality of sub-pixel area SPAs during one frame period, based on the gate control signal GDC. That is, the gate driver 21 supplies the scan signal SCAN to the gate line GL corresponding to each horizontal line during each horizontal period corresponding to each horizontal line during one frame period. The horizontal line includes sub-pixel area SPAs arranged in a line in a horizontal direction among the plurality of sub-pixel area SPAs.

The data driver 22 converts the rearranged digital video data RGB' into an analog data voltage based on the data control signal DDC. The data driver 22 supplies a data signal VDATA corresponding to each of the sub-pixel areas SPAs included in each horizontal line of the display panel 20 during each horizontal period to the data line DL, based on the rearranged digital video data RGB'.

As shown in FIG. 3, each sub-pixel area SPA includes an organic light-emissive element OLED and an element driving circuit DC supplying a driving signal to the organic light-emissive element OLED. The element driving circuit DC may include a driving thin-film transistor DT, a switching thin-film transistor ST, and a storage capacitor Cst. However, this is only an example. Alternatively, each sub-pixel area SPA may further include a compensation circuit (not shown) to compensate for deterioration of at least one of the driving thin-film transistor DT or the organic light-emissive element OLED in combination with the element driving circuit DC (not shown). The compensation circuit may include at least one thin-film transistor for sensing the deterioration or supplying a reference power (not shown).

The organic light-emissive element OLED includes first and second electrodes, for example, an anode and a cathode, and a layer made of an organic material and disposed between the first and second electrodes.

The driving thin-film transistor DT is connected in series to the organic light-emissive element OLED and is disposed between the first driving power line VDDL supplying the first driving power VDD and the second driving power line VSSL supplying the second driving power VSS having a lower potential than that of the first driving power VDD.

The switching thin-film transistor ST is disposed between the data line DL supplying the data signal VDATA of each sub-pixel area SPA and the gate electrode of the driving thin-film transistor DT.

The storage capacitor Cst is disposed between a first node ND1 and a second node ND2.

The first node ND1 refers to a contact point between the switching thin-film transistor ST and the gate electrode of the driving thin-film transistor DT. The second node ND2 refers a contact point between the driving thin-film transistor DT and the organic light-emissive element OLED.

An operation of this element driving circuit DC is as follows.

When the switching thin-film transistor ST is turned on based on the scan signal SCAN of the gate line GL, the data signal VDATA of the data line DL is supplied to the gate electrode of the driving thin-film transistor DT connected to the first node ND1 and the storage capacitor Cst.

The storage capacitor Cst is charged with the data signal VDATA supplied to the first node ND1.

The driving thin-film transistor DT is turned on based on the data signal VDATA supplied to the first node ND1 and a charged voltage of the storage capacitor Cst. In this connection, the turned-on driving thin-film transistor DT may allow a drive current corresponding to the data signal VDATA to be supplied to the second node ND2, that is, the organic light-emissive element OLED.

Next, the general area 11 and the camera area 12 of the display area 10 according to an embodiment according to the present disclosure will be described.

Figure 4:
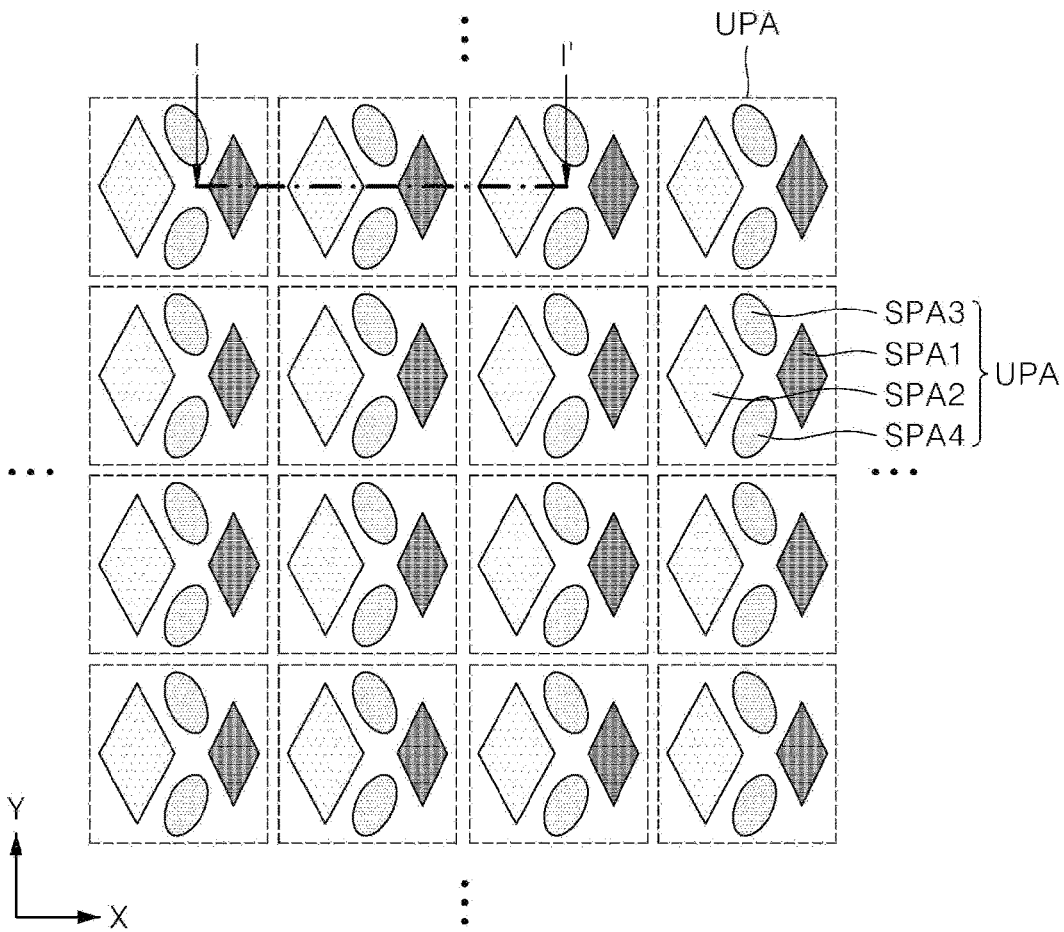
FIG. 4 is a diagram showing sub-pixel areas disposed in a general area in the display area of FIG. 1.
Figure 5:
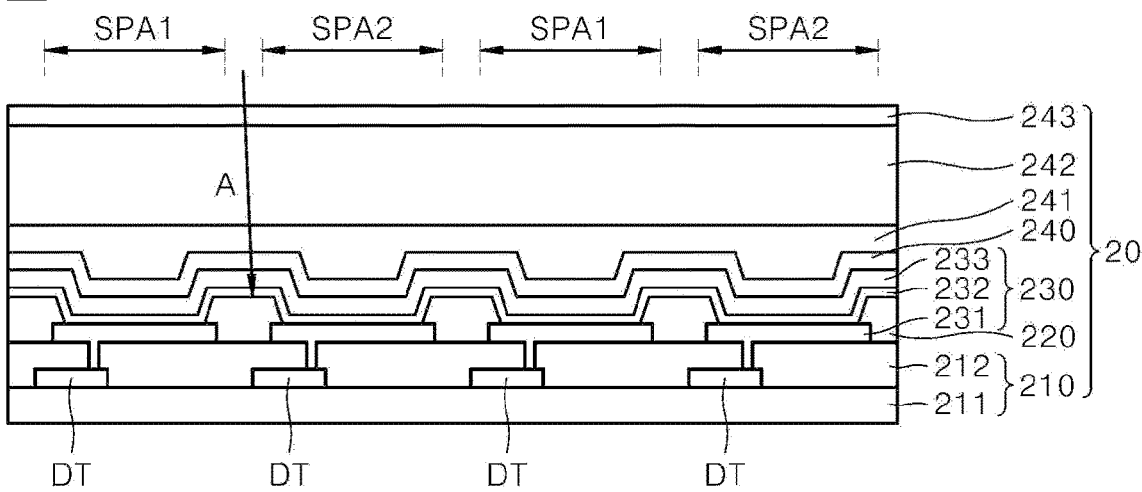
FIG. 5 is a diagram showing an example of I-I' in FIG. 4.

FIG. 4 is a diagram showing sub-pixel areas disposed in the general area in the display area of FIG. 1. FIG. 5 is a diagram showing an example of I-I' in FIG. 4.

As shown in FIG. 4, in the general area 11 of the display area 10 of the display panel 20 that does not overlap with the camera (not shown), a plurality of unit pixel areas UPAs are arranged in a matrix form defined in first and second directions (e.g., X and Y, respectively). That is, the plurality of unit pixel areas UPAs arranged in the general area 11 are adjacent to each other in the first and second directions (e.g., X and Y, respectively).

Each unit pixel area UPA includes at least two sub-pixel areas SPA1, SPA2, SPA3, and SPA4 corresponding to at least two colors. In this connection, the at least two colors may include red, green and blue. Alternatively, the at least two colors may further include white.

The at least two sub-pixel areas SPA1, SPA2, SPA3, and SPA4 included in each unit pixel area UPA may correspond to different colors. Alternatively, at least two of the at least two sub-pixel areas SPA1, SPA2, SPA3, and SPA4 included in each unit pixel area UPA may correspond to the same color and remaining ones thereof may correspond to different colors.

In one example, as shown in FIG. 4, among the at least two sub-pixel areas SPA1, SPA2, SPA3, and SPA4 included in each unit pixel area UPA, the first sub-pixel area SPA1 may correspond to red, the second sub-pixel area SPA2 may correspond to blue, and the remaining third and fourth sub-pixel areas SPA3 and SPA4 may correspond to green.

The second sub-pixel area SPA2 corresponding to blue light may have the widest width among those of the at least two sub-pixel areas SPA1, SPA2, SPA3, and SPA4 included in each unit pixel area UPA. Further, the third and fourth sub-pixel areas SPA3 and SPA4 corresponding to the green light may be the same and may have the smallest width among those of the at least two sub-pixel areas SPA1, SPA2, SPA3, and SPA4 included in each unit pixel area UPA.

In addition, the sub-pixel areas arranged in a line in the second direction Y may correspond to the same color.

Further, the first and second sub-pixel areas SPA1 and SPA2 respectively corresponding to red and blue are alternately arranged in the first direction X, while the third and fourth sub-pixel areas SPA3 and SPA4 corresponding to green are arranged in a line in the second direction Y.

As shown in FIG. 5, in the general area 11 that does not overlap with the camera, the display panel 20 may include the first and second sub-pixel areas SPA1 and SPA2 which are alternately arranged with each other in the first direction X.

The display panel 20 includes a transistor array substrate 210 including a plurality of thin-film transistors (DT and ST of FIG. 3), a bank 220 and a plurality of organic light-emissive elements 230 disposed above the transistor array substrate 210, and, and a plurality of insulating material films 241, 242, 243, and 244 covering the organic light-emissive element 230.

The transistor array substrate 210 includes a substrate 211 in which the display area 10 is defined, the driving thin-film transistor DT disposed above the substrate 211 and corresponding to each of the sub-pixel areas SPA1 and SPA2, and a planarization film 212 covering the driving thin-film transistor DT.

The bank 220 is disposed above the planarization film 212 and corresponds to an outer periphery of each of the plurality of sub-pixel areas SPA1 and SPA2.

The plurality of organic light-emissive elements 230 disposed above the transistor array substrate 210 correspond to the plurality of sub-pixel areas SPA1 and SPA2.

The display panel 20 includes a plurality of first electrodes 231 disposed above the planarization film 212, and corresponding to the plurality of sub-pixel areas SPA1 and SPA2, a light-emissive layer 232 disposed above the first electrodes 231 and the bank 220, and a second electrode 233 disposed above the emissive layer 232.

The bank 220 covers an edge of each of the plurality of first electrodes 231.

The light-emissive layer 232 covers the first electrode 231 and the bank 220.

The light-emissive layer 232 may be made of an organic light-emissive material. In one example, the light-emissive layer 232 may include a hole transport layer, at least one light-emissive layer, and an electron transport layer. Alternatively, the light-emissive layer 232 may further include at least one of a hole injection layer or an electron injection layer.

In an area where the light-emissive layer 232 is disposed between the first and second electrodes 231 and 233, light is emitted from the light-emissive layer 232 via the drive current between the first and second electrodes 231 and 233.

In order to prevent easy deterioration of the light-emissive layer 232 due to the moisture or oxygen, the plurality of organic light-emissive element 230 may be sealed with a plurality of insulating material films 241, 242, 243, and 244.

In one example, the display panel 20 may further include a first protective film (insulating material film) 241 that covers the second electrode 233 in a planarized manner, and a second protective film (insulating material film) 242 that covers the first protective film 241 in a planarized manner.

Further, the display panel 20 may further include a third protective film (insulating material film) 243 disposed above the second protective film 242.

Further, the display panel 20 may further include a passivation film 240 disposed between the second electrode 233 and the first protective film 241. The passivation film 240 may be made of an inorganic insulating material.

The first protective film 241 may be made of an organic insulating material that allows a thickness enough to achieve a planarized top face free of a curve. On the other hand, the second electrode 243 is made of an inorganic conductive material. Disposing the passivation film 240 made of the inorganic insulating material between the second electrode 243 and the first protective film 241 may allow fixation of the first protective film 241 to be facilitated.

Figure 6:
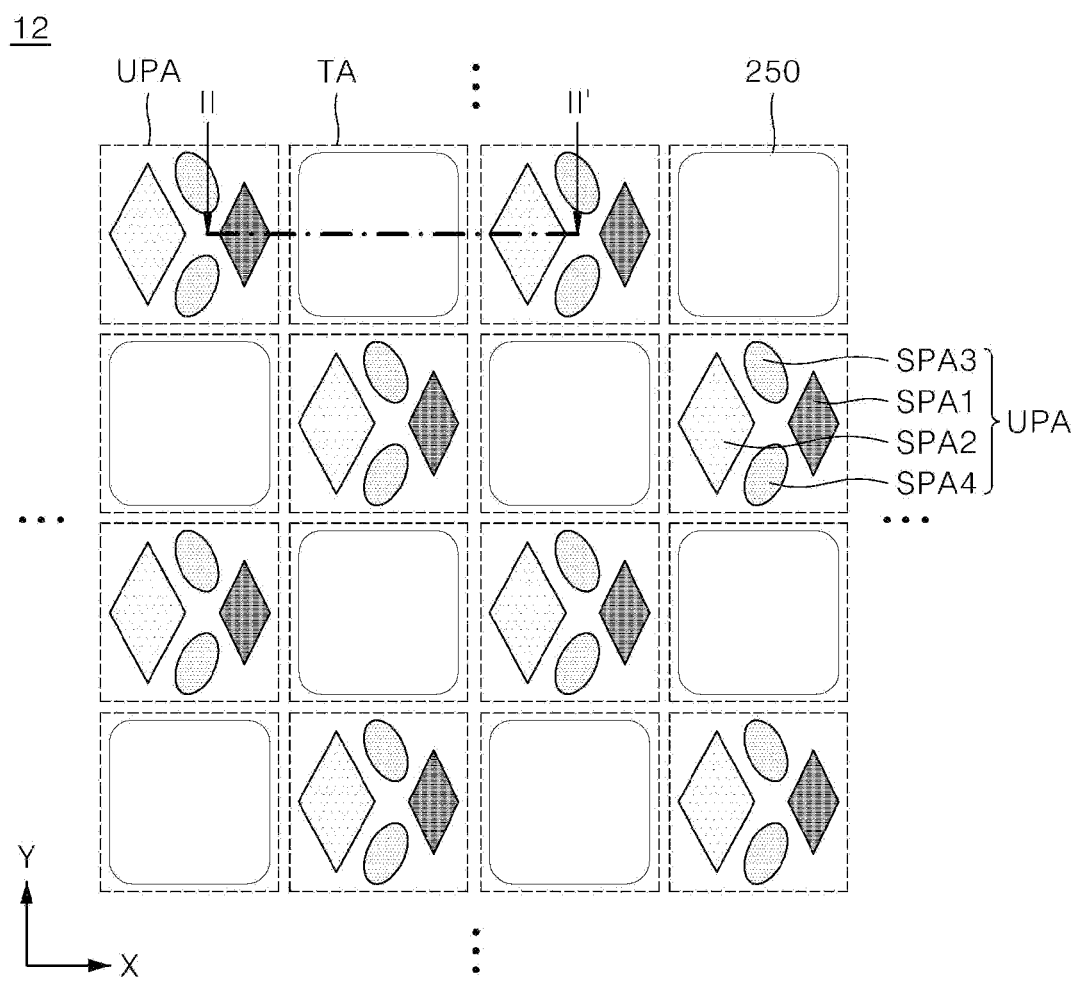
FIG. 6 is a diagram showing sub-pixel areas and transmissive areas arranged in a camera area in the display area in FIG. 1.
Figure 7:
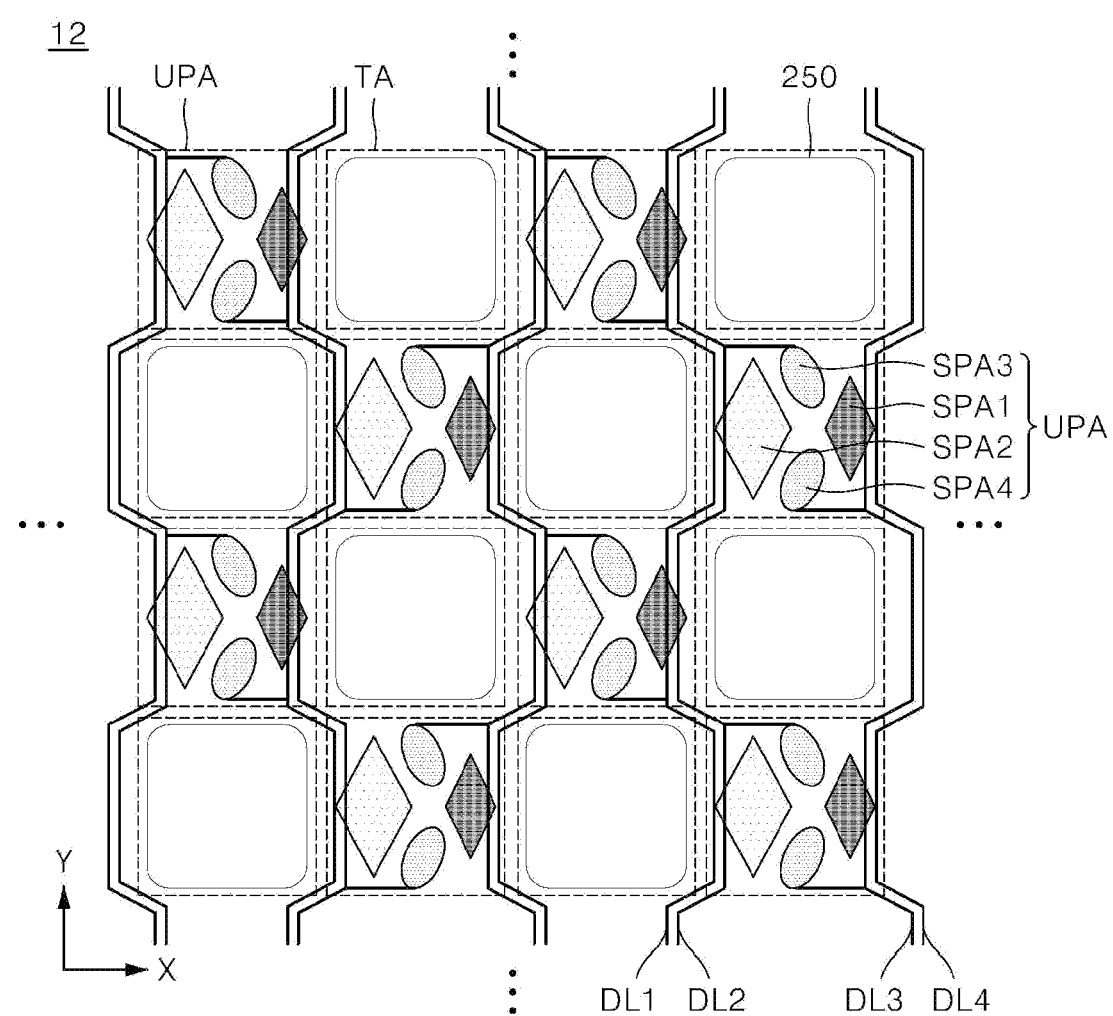
FIG. 7 is a diagram showing an example of a signal line disposed in the camera area in the display area of FIG. 1.
Figure 8:
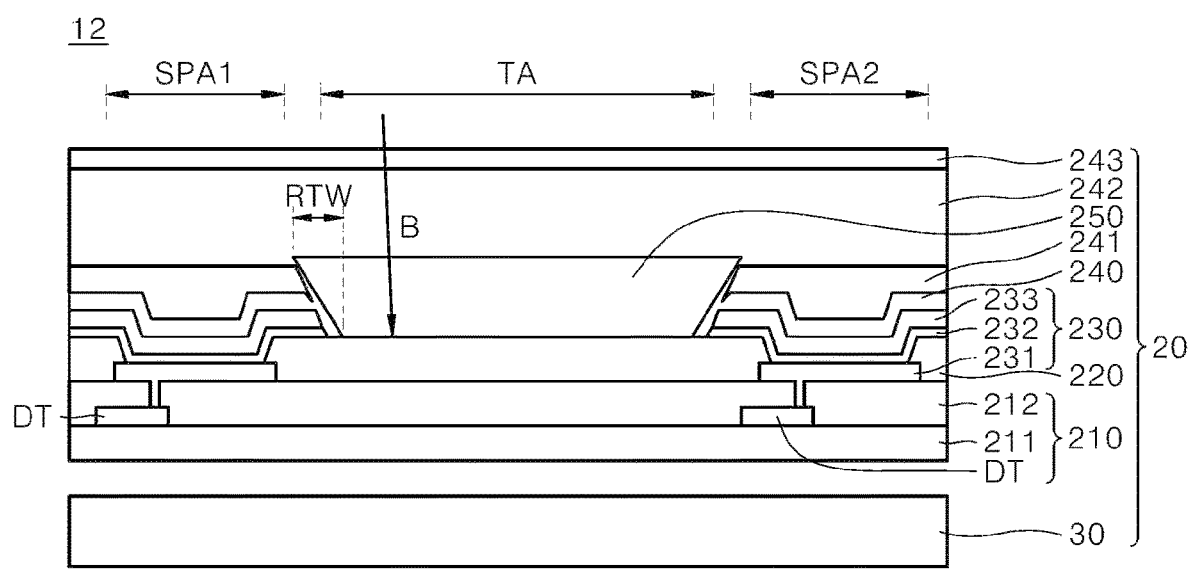
FIG. 8 is a diagram showing an example of II-II' in FIG. 6.

FIG. 6 is a diagram showing sub-pixel areas and transmissive areas arranged in the camera area in the display area in FIG. 1. FIG. 7 is a diagram showing an example of a signal line disposed in the camera area in the display area of FIG. 1. FIG. 8 is a diagram showing an example of II-II' in FIG. 6.

As shown in FIG. 6, the camera area 12 overlapping the camera (not shown) in the display area 10 of the display panel 20 may include at least two unit pixel areas UPAs, and a plurality of transmissive areas TA alternately arranged with the at least two unit pixel areas UPAs.

In one example, as shown in FIG. 6, in the camera area 12, the unit pixel areas UPA and the transmissive areas TA may be arranged into a matrix and may be arranged alternately with each other one by one.

Alternatively, although not shown separately, in the camera area 12, the unit pixel areas UPA and the transmissive areas TA may be alternately arranged with each other by at least two by at least two and may be arranged into a matrix.

However, this is only an example. the camera area 12 may include at least two unit pixel areas UPA corresponding to a resolution sufficient to implement the image display function. Depending on the resolution of the camera area 12, two adjacent unit pixel areas UPAs among the at least two unit pixel areas UPAs arranged in the camera area 12 may be spaced apart from each other by at least one transmissive area TA.

The transmissive area TA refers to an area for transmitting light therethrough to the camera (not shown) disposed below the rear face of the display panel 20. That is, light may be transmitted to the camera (not shown) through the transmissive area TA of the display panel 20.

In the transmissive area TA, a partition 250 may be disposed to improve transmittance.

Further, in order to improve the transmittance of the transmissive area TA, a light-screening material constituting the signal line and the electrode in the sub-pixel area SPA may not be disposed in the transmissive area TA.

As shown in FIG. 7, the data line DL extending in the second direction Y may bypass the transmissive area TA.

In one example, as shown in FIG. 7, first and second data lines DL1 and DL2 respectively corresponding to the first and third sub-pixel areas SPA1 and SPA3 may be disposed on one side (on a left side of FIG. 7) in the first direction X of the unit pixel area UPA, where third and fourth data lines DL3 and DL4 respectively corresponding to the second and fourth sub-pixel areas SPA2 and SPA4 may be disposed on the other side (on a right side of FIG. 7) in the first direction X of the unit pixel area UPA.

The first and second data lines DL1 and DL2 is bent inwardly of the unit pixel area UPA so as not to invade the transmissive area TA adjacent to one side (the left side of FIG. 7) in the first direction X of the unit pixel area UPA.

Similarly, the third and fourth data lines DL3 and DL4 is bent inwardly of the unit pixel area UPA so as not to invade the transmissive area TA adjacent to the other side (the right of FIG. 7) in the first direction X of the unit pixel area UPA.

Accordingly, since the signal line DL made of the light-screening material is not disposed in the transmissive area TA, a factor of deteriorating the transmittance of the transmissive area TA may be reduced or eliminated. That is, an amount of light directed to the camera (not shown) may be prevented from being lowered due to the signal line DL made of the light-screening material. Therefore, while maintaining the image display function in the display area 10, the performance of the camera (not shown) may be improved easily.

As shown in FIG. 8, the display device DD according to an embodiment according to the present disclosure includes the display panel 20 including the display area on which an image is displayed, and a camera 30 disposed below a rear face of the display panel 20 and overlapping the camera area 12 as a portion of the display area 10.

The display area 10 includes a plurality of sub-pixel area SPAs. At least two sub-pixel areas adjacent to each other among the plurality of sub-pixel area SPAs correspond to one unit pixel area UPA.

As shown in FIG. 1, the display area 10 includes a general area 11 that does not overlap with the camera (30 in FIG. 8) and a camera area 12 that overlaps with the camera (30 in FIG. 8).

In the general area 11, a plurality of unit pixel area UPAs are arranged in a line to form a matrix.

The camera area 12 includes at least two unit pixel areas UPA and a plurality of transmissive areas TAs alternately arranged with the at least two unit pixel area UPA. That is, in the camera area 12, the plurality of unit pixel area UPAs and the plurality of transmissive area TAs may be arranged into a matrix and may be arranged alternately with each other by at least one by at least one.

The display panel 20 includes a bank 220 corresponding to an outer periphery of each of the plurality of sub-pixel areas SPA1 and SPA2, and a partition 250 disposed above the bank 220 and corresponding to each of the plurality of transmissive areas TA.

The display panel 20 further includes a transistor array substrate 210 including a substrate 211 in which the display area 10 is defined, a plurality of thin-film transistors DT disposed above the substrate 211, and a planarization film 212 covering the plurality of thin-film transistors DT. The display panel 20 further includes a plurality of first electrodes 231 disposed above the planarization film 212 of the transistor array substrate 210 and corresponding to the plurality of sub-pixel areas SPA1 and SPA2. The display panel 20 further includes a light-emissive layer 232 disposed above the first electrode 231 and the bank 220 and spaced from the partition 250, and a second electrode 233 disposed above the light-emissive layer 232. In this connection, the bank 220 covers an edge of each of the plurality of first electrodes 231.

Further, the display panel 20 may further include a first protective film 241 covering the second electrode 233, and a second protective film 242 covering the partition 250 and the first protective film 241.

Further, the display panel 20 may further include a third protective film 243 disposed above the second protective film 242.

Further, the display panel 20 may further include a passivation film 240 disposed between each of the second electrode 233 and the partition 250 and the first protective film 241. The passivation film 240 is made of an inorganic insulating material to allow fixing of the first protective film 241 made of the organic insulating material to be facilitated.

Due to an etching ratio between the light-emissive layer 232, the second electrode 233, the passivation film 240, and the first protective film 241, the partition 250 protrudes convexly toward the second protective film 242.

Further, a top face of the partition 250 is in direct contact with the second protective film 242.

The partition 250 may be constructed such that an edge of a top face thereof may protrude beyond an edge of a bottom face thereof, and a side face connecting the top face and the bottom face to each other may be inclined at an angle of 90 degrees or smaller with respect to an extension line of the bottom face.

That is, the partition 250 may have a reverse-tapered cross section.

In one example, a width RTW (Reverse Tapered Width) by which the edge of the top face of the partition 250 protrudes beyond the edge of the bottom face of the partition 250 may be 1.5 µm or greater.

The light-emissive layer 232 may be divided via the reverse-tapered partition 250. The second electrode 233 may be divided via the reverse-tapered partition 250. Thus, when the light-emissive layer 232 and the second electrode 233 disposed above the partition 250 are removed. the light-emissive layer 232 and the second electrode 233 may not be disposed in this transmissive area TA. In this way, a decrease in transmittance of the transmissive area TA due to the light-emissive layer 232 and the second electrode 233 may be prevented.

Further, a refractive index of the partition 250 may be in a range between a refractive index of the second protective film 242 covering the partition 250 and a refractive index of the substrate 211 facing the camera 30. In this way, the partition 250 is included in a path of light from an outside to the camera 30 through the display panel 20, such that the transmittance may be improved.

In one example, when the second protective film 243 is made of an organic insulating material having a refractive index of 1.53, and the substrate 211 is made of polyimide PI having a refractive index of 1.64, the partition 250 may be made of an insulating material having a refractive index in a range of 1.53 to 1.64. For example, the partition 250 may be made of a negative type photoresist.

Thus, the transmittance of the transmissive area TA of the display panel 20 may be improved due to the partition 250.

Figure 9:
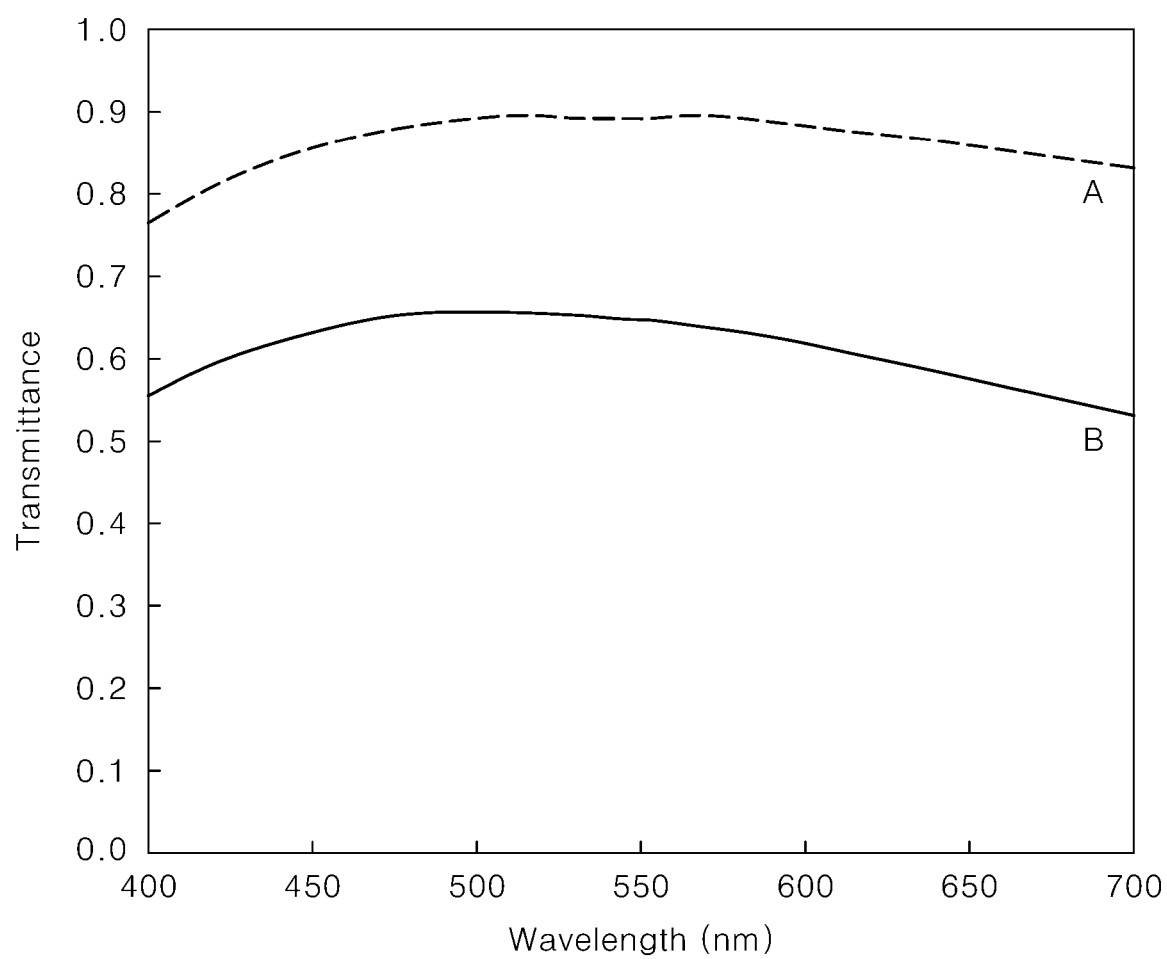
FIG. 9 is a diagram showing a transmittance in each wavelength band corresponding to a path A in FIG. 5 and a transmittance in each wavelength band corresponding to a path B in FIG. 8.

FIG. 9 is a diagram showing a transmittance in each wavelength band corresponding to a path A in FIG. 5 and a transmittance in each wavelength band corresponding to a path B in FIG. 8.

As shown in FIG. 5, the path A corresponds to an outer periphery of each sub-pixel area SPA, and includes the light-emissive layer 232 and the second electrode 233 disposed above the bank 220.

As shown in FIG. 8, the path B corresponds to the transmissive area TA of the camera area 12, and includes the partition 250 disposed above the bank 220. In other words, the path B does not include the light-emissive layer 232 and the second electrode 233, unlike the path A in FIG. 5.

Accordingly, it may be identified that as shown in FIG. 9, in a wavelength band of 400 nm to 700 nm corresponding to visible light, a transmittance of the B path is higher than that of the A path.

As described above, the B path corresponding to the transmissive area TA does not include the light-emissive layer 232 and the second electrode 233, and includes the partition 250 made of an insulating material having a refractive index between the refractive index of the second protective film 242 and that of the substrate 211. Accordingly, the transmittance of the camera area 12 including the transmissive area TA may be improved compared to that of the general area 11. As a result, the light detection sensitivity of the camera 30 disposed under the camera area 12 may be prevented from being deteriorated due to the display panel 20.

Accordingly, the display device DD according to an embodiment according to the present disclosure includes the camera 30 disposed under the display panel 20 and overlapping a portion of the display area 10.

The camera area 12 of the display area 10 overlapping the camera 30 includes the unit pixel area UPA and the transmissive area TA that are alternately arranged with each other to form a matrix. Accordingly, the external light may be transmitted to the camera 30 through the transmissive area TA of the display panel 20, such that the display device DD may provide an imaging function achieved by the camera 30, and an image display function over the entire display area 10. That is, an increase in the bezel width and deformation of the display area 10 due to the camera 30 may be prevented. Accordingly, the user's convenience when using the image display function may be improved.

In addition, the display panel 20 of the display device DD includes the partition 250 corresponding to the transmissive area TA.

The partition 250 has the reverse-tapered cross section and is disposed on the bank 220. Thus, each of the light-emissive layer 232 and the second electrode 233 is divided via the partition 250, and the top face of the partition 250 is in direct contact with the second protective film 242. That is, the light-emissive layer 232 and the second electrode 233 are not disposed in the transmissive area TA. Accordingly, the number of interfaces at which the refractive index changes rapidly is smaller in the transmissive area TA, compared to that in the sub-pixel area SPA and an outer periphery thereof, such that the transmittance of the transmissive area TA may be improved.

Further, the partition 250 is made of a material having a refractive index selected from a range between the refractive index of the second protective film 242 covering the partition 250 and the refractive index of the substrate 211 facing the camera 30. This partition 250 may allow the transmittance of the transmissive area TA to be further improved.

Next, a method for manufacturing a display device according to an embodiment according to the present disclosure will be described with reference to FIGS. 10 and 11 to 21.

Figure 10:
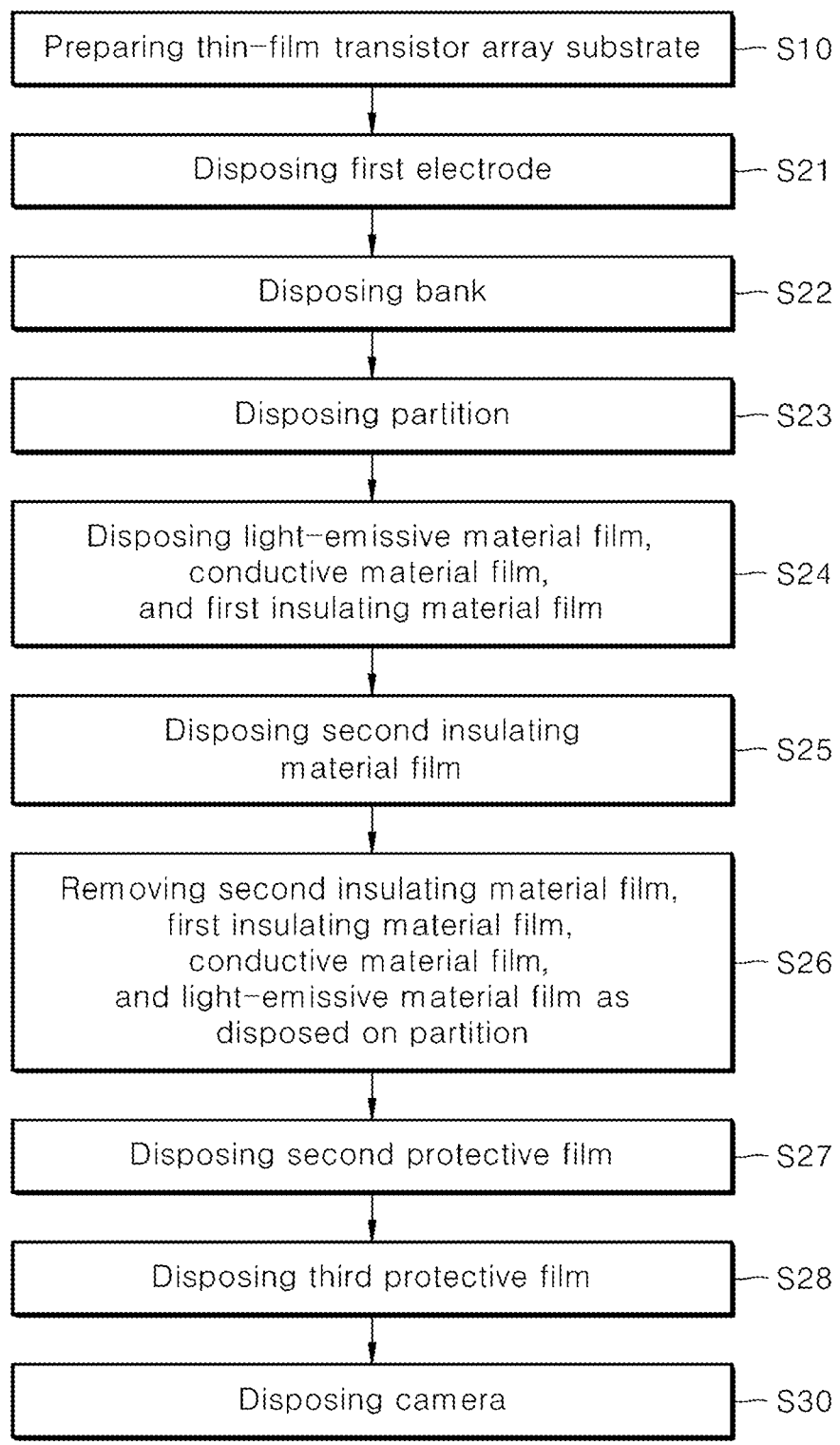
FIG. 10 is a diagram showing a method for manufacturing a display device according to an embodiment according to the present disclosure.

FIG. 10 is a diagram showing a method for manufacturing a display device according to an embodiment according to the present disclosure.

FIGS. 11 to 20 are diagrams showing processes according to steps in FIG. 10, respectively.

As shown in FIG. 10, a method for manufacturing a display device according to an embodiment according to the present disclosure includes a step S10 of preparing the thin-film transistor array substrate 210 including the plurality of thin-film transistors DT disposed above the substrate 211 in which the display area 10 is defined, and the planarization film 212 covering the plurality of thin-film transistor DT, a step S21 of disposing the plurality of first electrodes 231 respectively corresponding to the plurality of sub-pixel areas SPAs included in the display area 10 on the planarization film 212, a step S22 of disposing the bank 220 corresponding to the outer periphery of each of the plurality of sub-pixel areas SPAs and covering the edge of each of the first electrodes 231 on the planarization film 212, a step S23 of disposing the partition 250 corresponding to each of a plurality of transmissive areas TA included in the camera area 12 as a portion of the display area 10 on the bank 220, a step S24 of disposing a light-emissive material film covering the first electrode 231, the bank 220 and the partition 250, a conductive material film covering the light-emissive material film, and a first insulating material film covering the conductive material film, a step S25 of disposing a second insulating material film covering the first insulating material film in a planarized manner, and a step S26 of removing portions of each of the second insulating material film, the first insulating material film, the conductive material film, and the light-emissive material film which are disposed above the partition 250.

In the step S26 of removing the portions of each of the second insulating material film, the first insulating material film, the conductive material film, and the light-emissive material film which are disposed above the partition 250, the light-emissive layer 232, the second electrode 233, the passivation film 240 and the first protective film 241 are provided. At this time, the top face of partition 250 is not covered with the passivation film 240 and the first protective film 241.

The method for manufacturing a display device according to an embodiment according to the present disclosure may further include, after the step S26 of removing the portions of each of the second insulating material film, the first insulating material film, the conductive material film and the light-emissive material film which are disposed above the partition 250, a step S27 of disposing the second protective film 242 covering the partition 250 and the first protective film 241 in a planarized manner.

In the step S27 of disposing the second protective film 242, the top face of the partition 250 directly contacts the second protective film.

Further, the method for manufacturing a display device according to an embodiment according to the present disclosure may further include a step S28 of disposing the third protective film 243 covering the second protective film 242.

Further, the method for manufacturing a display device according to an embodiment according to the present disclosure may further include a step S30 of disposing the camera 30 overlapping the camera area 12 on a bottom face of thin-film transistor array substrate 210.

Figure 11:
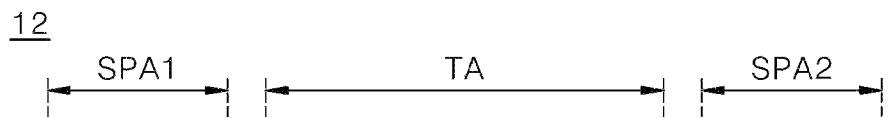
FIGS. 11 to 20 are diagrams showing processes according to steps in FIG. 10, respectively.
Figure 11:
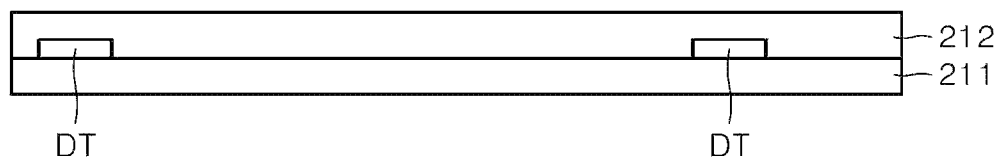

As shown in FIG. 11, the step S10 of preparing the thin-film transistor array substrate 210 may include a step of preparing the substrate 211 in which the display area 10 is defined, a step of disposing the thin-film transistor DT corresponding to each of the sub-pixel areas SPA1 and SPA2 on the substrate 201, and a step of disposing the planarization film 212 covering the thin-film transistor DT.

The thin-film transistor array substrate 210 further includes the plurality of signal lines (GL, DL, and VDDL in FIG. 3) which define the plurality of sub-pixel area SPAs in the display area 10 and supplies signals to each of the sub-pixel areas SPA1 and SPA2.

The thin-film transistor array substrate 210 may further include the switching thin-film transistor (ST in FIG. 3), the driving thin-film transistor (DT in FIG. 3), and the storage capacitor (Cst FIG. 3) corresponding to each of the sub-pixel areas SPA.

All of the plurality of signal lines (GL, DL, and VDDL in FIG. 3), the switching thin-film transistor (ST in FIG. 3), the driving thin-film transistor (DT in FIG. 3), and the storage capacitor (Cst in FIG. 3) are covered with the planarization film 212.

The display area 10 include the general area 11 in which the plurality of sub-pixel areas (SPA1, SPA2, SPA3, and SPA4 of FIG. 4) are arranged in a matrix structure, and the camera area 12 in which the transmissive area TA to transmit light to be directed to the camera is disposed between adjacent sub-pixel areas SPA1 and SPA2.

Figure 12:
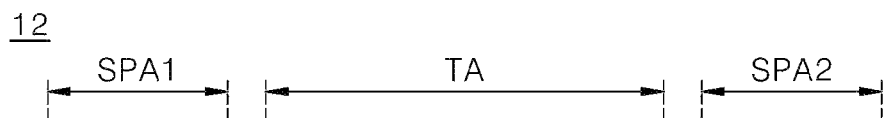
Figure 12:
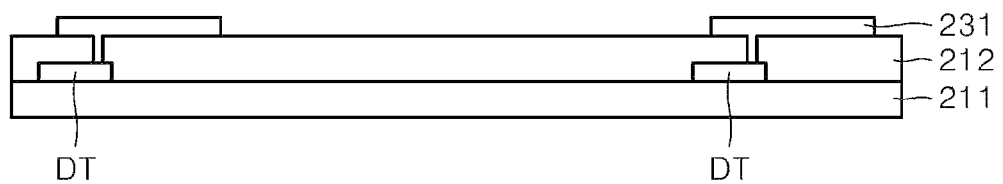

As shown in FIG. 12, the first electrode 231 corresponding to each of sub-pixel areas SPA1 and SPA2 is disposed above the planarization film 212 (S21).

The first electrode 231 is connected to the thin-film transistor DT corresponding to each of sub-pixel areas SPA1 and SPA2 via a contact hole passing through the planarization film 212.

Figure 13:
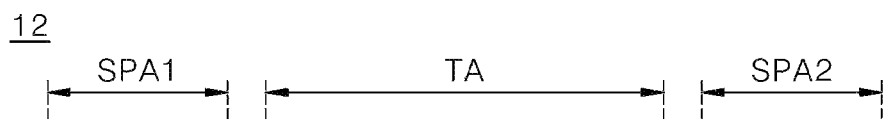
Figure 13:
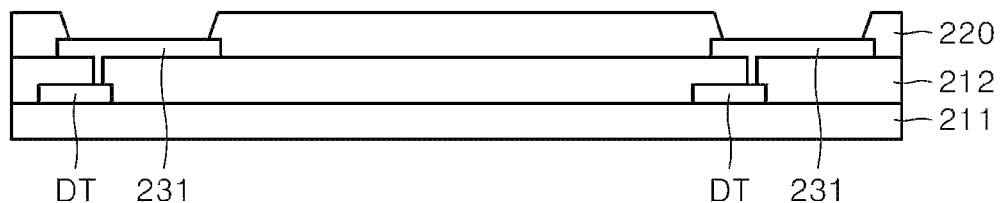

As shown in FIG. 13, the bank 220 corresponding to the outer periphery of each of sub-pixel areas SPA1 and SPA2 is disposed above the planarization film 212 (S22).

In each of the sub-pixel areas SPA1 and SPA2, the bank 220 covers the edge of the first electrode 231.

Subsequently, the step S23 in which the partition 250 corresponding to the plurality of transmissive areas TA included in the camera area 12 is disposed above the bank 220 includes disposing a photoresist material film made of a negative type photoresist covering the first electrode 231 and the bank 220 in a planarized manner, patterning the photoresist material film, and developing the photoresist material film, thereby providing the partition 250.

Figure 14:
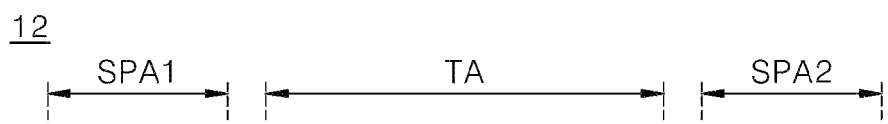
Figure 14:
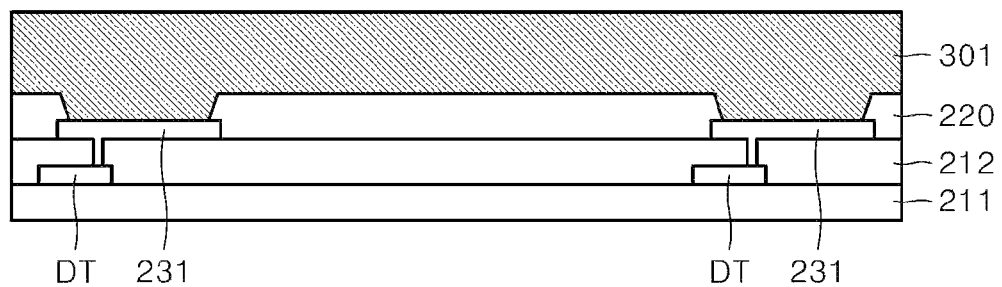

As shown in FIG. 14, a photoresist material film 301 made of a negative type photoresist covering the first electrode 231 and the bank 220 in a planarized manner is disposed.

Figure 15:
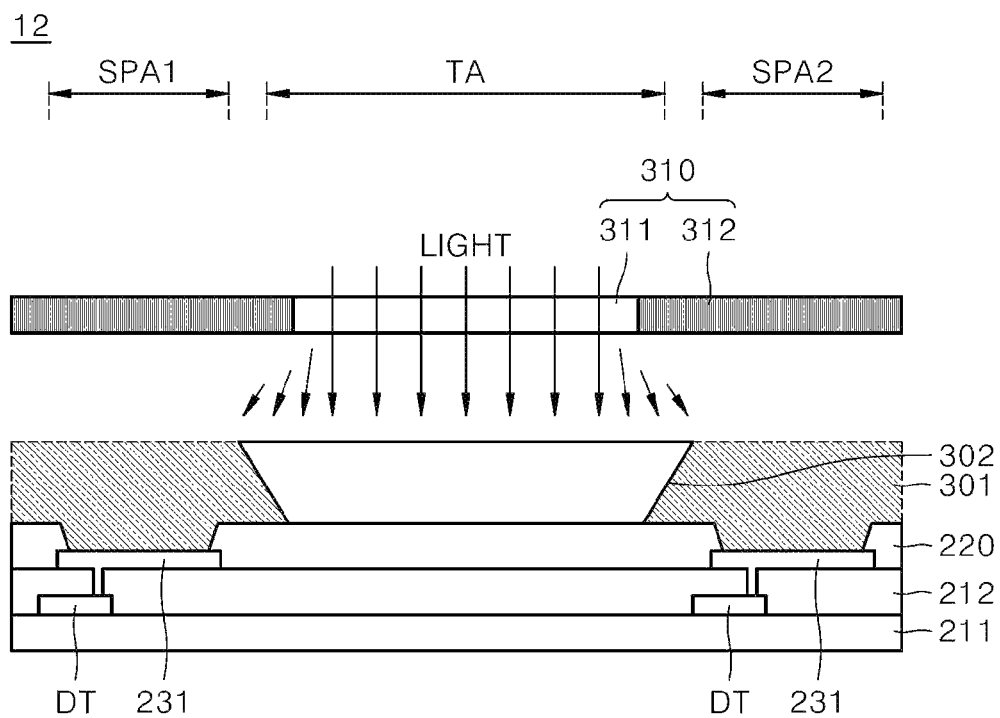

As shown in FIG. 15, while a patterning mask 310 is disposed on the photoresist material film 301, light is irradiated to the photoresist material film 301 to pattern the photoresist material film 301.

The patterning mask 310 may include a light transmitting portion 311 corresponding to the transmissive area TA and transmitting light therethrough, and a light blocking portion 312 blocking light.

In this connection, the photoresist material film 301 has a negative type, thus, a portion 302 of the photoresist material film 301 exposed to the light passing through the light transmitting portion 311 of the patterning mask 310 is cured by the light.

In addition, due to the scattered or diffused light at the edge of the light transmitting part 311, the cured portion 302 of the photoresist material film 301 may have a reverse-tapered cross section.

In this connection, a cross-sectional shape of the cured portion 302 of the photoresist material film 301 may be adjusted according to an irradiation time and an intensity of light irradiated to the photoresist material film 301. In one example, as the irradiation time of light is longer than a threshold value or the intensity of light is greater than a threshold value, a cross section of the cured partial 302 of the photoresist material film 301 may be formed in a shape closer to a rectangle than a reverse-tapered shape.

Figure 16:
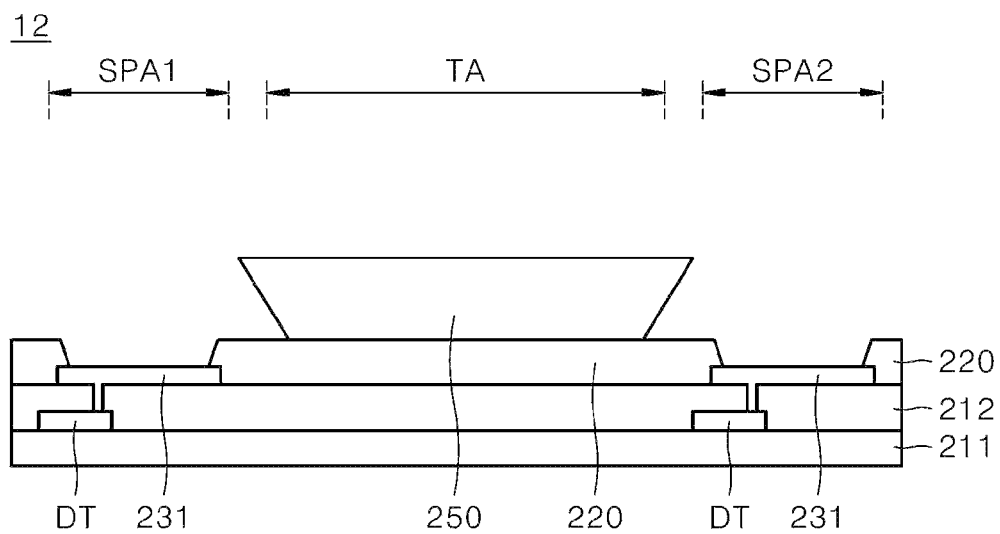

As shown in FIG. 16, a rest of the photoresist material film 301 except for the cured portion 302 is removed using the developing process.

As a result, the partition 250 corresponding to the transmissive area TA and disposed above the bank 220 is provided as the cured photoresist material film (302 in FIG. 16).

Figure 17:
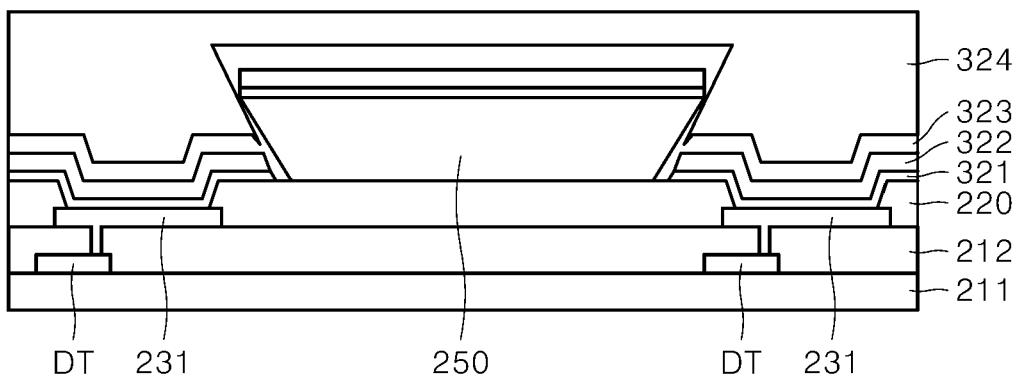

As shown in FIG. 17, the light-emissive material film 321 covering the first electrode 231, the bank 220 and the partition 250, the conductive material film 322 covering the light-emissive material film 321, and the first insulating material film covering the conductive material film 322 323 are arranged vertically sequentially (S24).

Further, the second insulating material film 324 covering the first insulating material film 323 is disposed (S25).

The light-emissive material film 321 may be made of an organic light-emissive material. The light-emissive material film 321 is divided via the partition 250 having the reverse-tapered cross section.

The partition 250 is constructed such that a top face thereof protrudes beyond the bottom face thereof, and a side face thereof is inclined. Accordingly, the light-emissive material film 321 may not be disposed in a gap between the side face and the bottom face of the partition 250 during a deposition process. Thus, the light-emissive material film 321 is divided via the partition 250.

The conductive material film 322 is disposed above the light-emissive material film 321, and is divided via the partition 250 as in the light-emissive material film 321.

The first insulating material film 323 may be made of an inorganic insulating material such as SiO and $SiN_x$.

The second insulating material film 324 may be made of an organic insulating material that allows a thickness enough to cover a step due to the partition 250 in a planarized manner.

That is, the second insulating material film 324 has a planarized top face while covering the partition 250.

Figure 18:
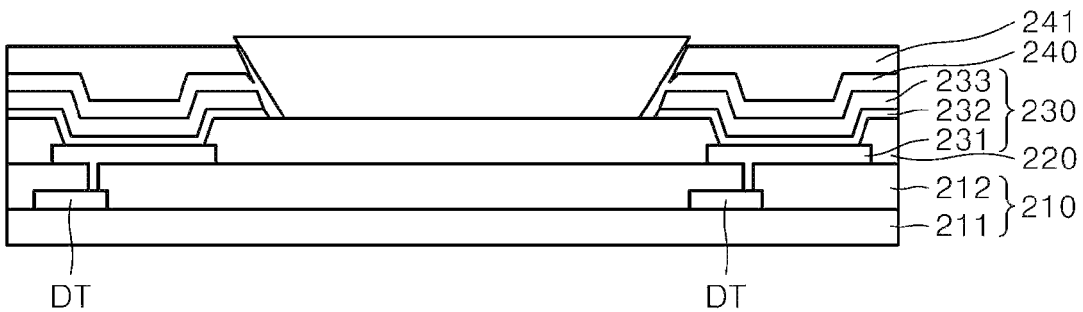

As shown in FIG. 18, in an etching process on a front face, the second insulating material film (324 in FIG. 18), the first insulating material film (323 in FIG. 18), and the conductive material film (322 in FIG. 18), the light-emissive material film (321 of FIG. 18) as disposed above the partition 250 are removed (S26).

As a result, the top face of the partition 250 is exposed without being covered with the second insulating material film (324 in FIG. 18), the first insulating material film (323 in FIG. 18), the conductive material film (322 in FIG. 18), and the light-emissive material film (321 in FIG. 18).

The light-emissive material film (321 in FIG. 18) remaining after an etching process S26 to expose the top face of the partition 250 acts as the light-emissive layer 232 disposed above the first electrode 231 and the bank 220.

The conductive material film (322 in FIG. 18) remaining after the etching process S26 acts as the second electrode 233 disposed above the light-emissive layer 232.

The first insulating material film (323 in FIG. 18) remaining after the etching process S26 acts as the passivation film 240 disposed above the second electrode 233.

The second insulating material film (324 in FIG. 18) remaining after the etching process S26 acts as the first protective film 241 that covers the passivation film 240 in a planarized manner.

In this connection, the etching process S26 is performed until the top face of the partition 250 is exposed. Thus, the top face of the partition 250 protrudes beyond the first protective film 241 due to an etching ratio between the materials.

Figure 19:
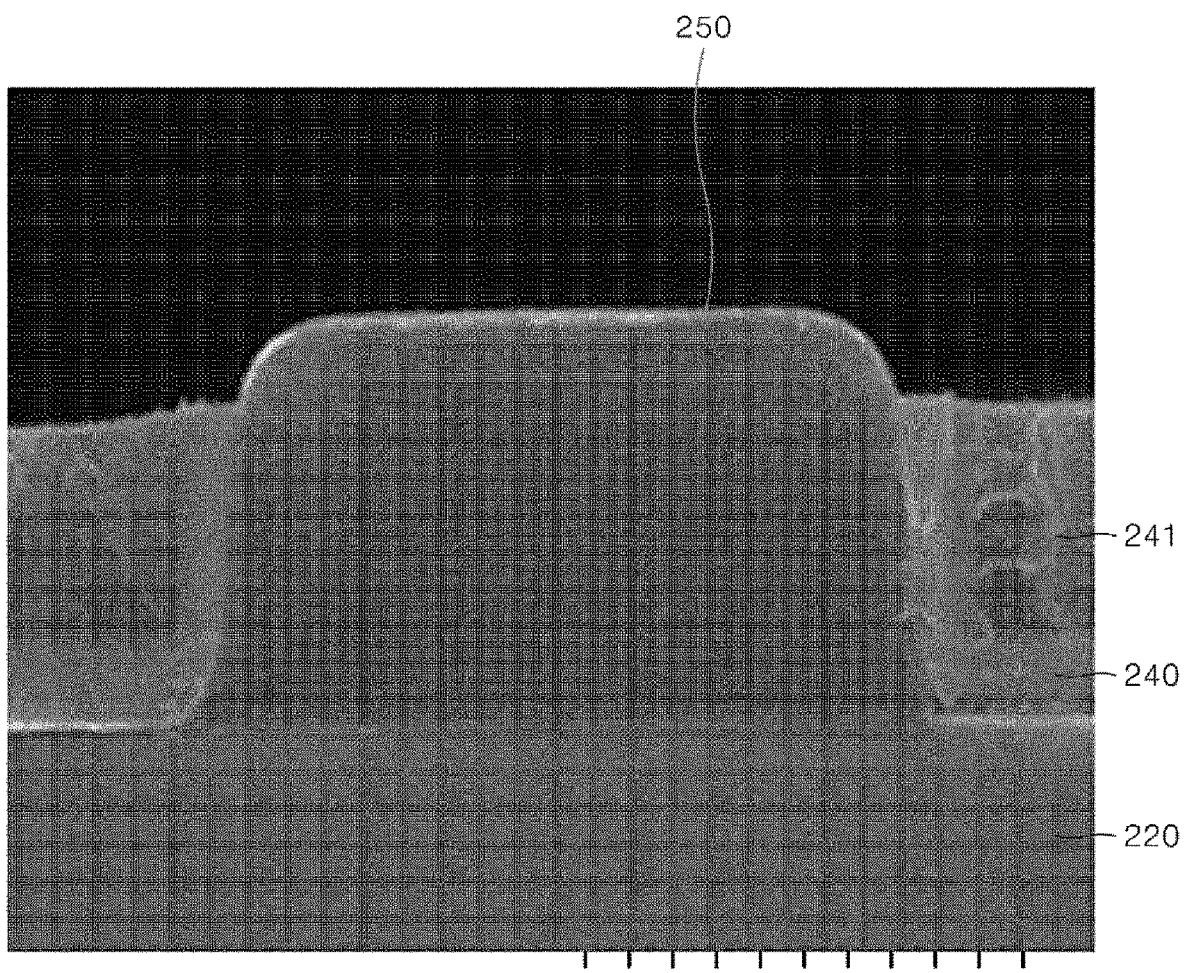

That is, as shown in FIG. 19, a portion of the side face of the partition 250 adjacent to the top face may not be covered with the first protective film 241. In FIG. 19, one interval may be about 5.0 μm.

Figure 20:
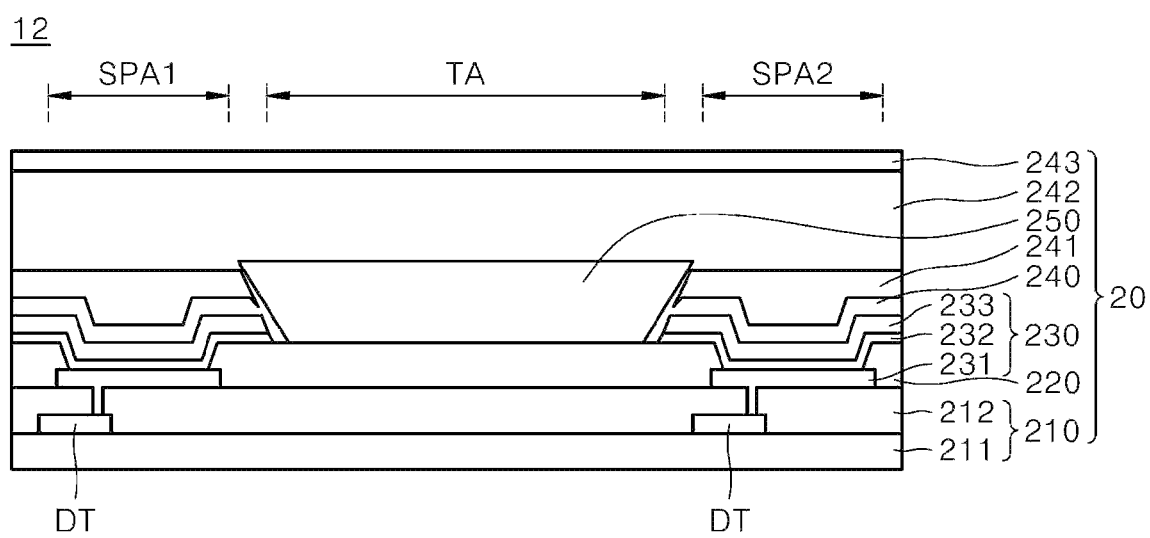

Next, as shown in FIG. 20, the second protective film 242 covering the partition 250 and the first protective film 241 is disposed (S27).

The second protective film 242 may be made of an organic insulating material that allows a thickness enough to cover the partition 250 in a planarized manner. In one example, the second protective film 242 may be made of the organic insulating material same as that of the first protective film 241.

To further enhance the sealing effect to prevent moisture and oxygen invasion, the third protective film 243 covering the second protective film 242 may be further disposed (S28).

Unlike the second protective film 242, the third protective film 243 may be made of an inorganic insulating material. Thus, as the number of interfaces is increased, the sealing may be more robust.

Then, as shown in FIG. 8, the camera 30 is disposed under the thin-film transistor array substrate 20 (S30).

The camera 30 overlaps the camera area 12 of the display area 10.

As described above, the method for manufacturing a display device according to an embodiment according to the present disclosure includes preparing the partition 250 made of a negative type photoresist material, thereby easily preparing the partition 250 having the reverse-tapered cross section.

Further, in order to prevent the decrease in transmittance of the transmissive area TA, the light-emissive layer 232, the second electrode 233, the passivation film 240, and the first protective film 241 should not be disposed in the transmissive area TA. Accordingly, in some embodiments, after sequentially stacking the light-emissive material film 321, the conductive material film 322, the first insulating material film 323 and the second insulating material film 324, an etching process on the front face is carried out until a top face of the partition 250 is exposed. As a result, removing the portions of each of the light-emissive layer 232, the second electrode 233, the passivation film 240, and the first protective film 241 from the transmissive area TA does not include patterning and developing processes using a mask. Thus, the process may be performed relatively easily and simply.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. All technical ideas within the scope of the present disclosure should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a display panel including a display area from which an image is output,
wherein the display area includes a camera area overlapping a camera disposed below a rear face of the display panel,
wherein the display area includes a plurality of sub-pixel areas,
wherein at least two adjacent sub-pixel areas among the plurality of sub-pixel areas correspond to one unit pixel area,
wherein the camera area of the display area further includes a plurality of transmissive areas which are alternately arranged with at least two unit pixel areas,
wherein the display panel includes:
a bank corresponding to an outer periphery of each of the plurality of sub-pixel areas; and
a partition disposed above the bank and corresponding to each of the plurality of transmissive areas.

2. The display device of claim 1, wherein the display panel further includes:
a transistor array substrate including a substrate in which the display area is defined, a plurality of thin-film transistors disposed above the substrate, and a planarization film covering the plurality of thin-film transistors;
a plurality of first electrodes disposed above the planarization film and respectively corresponding to the plurality of sub-pixel areas;
a light-emissive layer disposed above the plurality of first electrodes and the bank and spaced apart from the partition;
a second electrode disposed above the light-emissive layer;
a first protective film covering the second electrode; and
a second protective film covering the partition and the first protective film,
wherein the bank is disposed above the planarization film and covers an edge of each of the plurality of first electrodes.

3. The display device of claim 2, wherein a refractive index of the partition is between a refractive index of the second protective film and a refractive index of the substrate.

4. The display device of claim 2, wherein the partition protrudes convexly beyond the first protective film toward the second protective film.

5. The display device of claim 4, wherein a top face of the partition is in contact with the second protective film.

6. The display device of claim 2, wherein the display panel further includes a passivation film disposed between the first protective film and each of the second electrode and the partition.

7. The display device of claim 2, wherein the display panel further includes a third protective film covering the second protective film.

8. The display device of claim 2, wherein the transistor array substrate further includes at least one signal line connected to the plurality of thin-film transistors,
wherein a portion of the signal line is disposed outside each of the transmissive areas in the camera area.

9. The display device of claim 1, wherein the partition includes a reverse-tapered cross section,
wherein a width by which a edge of a top face of the partition protrudes beyond an edge of a bottom face of the partition is about 1.5 μm or greater.

10. The display device of claim 9, wherein the partition is made of a negative type photoresist.

11. A method for manufacturing a display device, the method comprising:
providing a thin-film transistor array substrate, including:
providing a substrate in which a display area is defined;
providing a plurality of thin-film transistors disposed above the substrate; and
providing a planarization film covering the plurality of thin-film transistors;
disposing a plurality of first electrodes above the planarization film, wherein each the plurality of first electrodes respectively corresponds to each of a plurality of sub-pixel areas included in the display area;
disposing a bank above the planarization film, wherein the bank corresponds to an outer periphery of each of the plurality of sub-pixel areas and covers an edge of each of the first electrodes;
disposing a partition above the bank, wherein the partition corresponds to each of a plurality of transmissive areas included in a camera area as a portion of the display area;
disposing a light-emissive material film covering the plurality of first electrodes, the bank, and the partition;
disposing a conductive material film covering the light-emissive material film;
disposing a first insulating material film covering the conductive material film;
disposing a second insulating material film covering the first insulating material film in a planarized manner; and
removing a portion of the second insulating material film disposed above the partition, a portion of the first insulating material film disposed above the partition, a portion of the conductive material film disposed above the partition, and a portion of the light-emissive material film disposed above the partition.

12. The method of claim 11, wherein removing the portions of each of the second insulating material film, the first insulating material film, the conductive material film, and the light-emissive material film which are disposed above the partition results in:
a formation of a light-emissive layer composed of the light-emissive material film, disposed above the plurality of first electrode and the bank, and spaced apart from the partition;
a formation of a second electrode composed of the conductive material film and disposed above the light-emissive layer;
a formation of a passivation film composed of the first insulating material film; and
a formation of a first protective film composed of the second insulating material film,
wherein the partition protrudes convexly beyond the first protective film.

13. The method of claim 12, wherein the method further comprises,
after removing the portions of each of the first and second insulating material films, the conductive material film, and the light-emissive material film, disposing a second protective film covering the partition and the first protective film in a planarized manner,
wherein a top face of the partition is in contact with the second protective film.

14. The method of claim 13, wherein a refractive index of the partition is between a refractive index of the second protective film and a refractive index of the substrate.

15. The method of claim 11, wherein in disposing the partition, the partition is made of a negative type photoresist and has a reverse-tapered cross section.

16. The method of claim 15, wherein a width by which a edge of a top face of the partition protrudes beyond an edge of a bottom face of the partition is about 1.5 µm or greater.

17. The method of claim 11, wherein in providing the thin-film transistor array substrate, the transistor array substrate further includes at least one signal line connected to the plurality of thin-film transistors, wherein a portion of the signal line is disposed outside each of the transmissive areas in the camera area.

* * * * *